US010423386B1

(12) United States Patent
Chung et al.

(10) Patent No.: US 10,423,386 B1
(45) Date of Patent: Sep. 24, 2019

(54) FIFO CIRCUIT FOR DDR MEMORY SYSTEM

(71) Applicant: FARADAY TECHNOLOGY CORPORATION, Hsinchu (TW)

(72) Inventors: Chang-Chin Chung, Hsinchu (TW); Shen-Chang Wang, Hsinchu (TW)

(73) Assignee: Faraday Technology Corp., Hsin-Chu (TW)

( * ) Notice: Subject to any disclaimer, the term of this patent is extended or adjusted under 35 U.S.C. 154(b) by 0 days.

(21) Appl. No.: 16/012,392

(22) Filed: Jun. 19, 2018

(30) Foreign Application Priority Data

May 3, 2018 (TW) ................. 107115107

(51) Int. Cl.
*G06F 5/10* (2006.01)
*G11C 8/18* (2006.01)
*G11C 7/10* (2006.01)

(52) U.S. Cl.
CPC .............. *G06F 5/10* (2013.01); *G11C 7/1006* (2013.01); *G11C 8/18* (2013.01); *G06F 2205/106* (2013.01)

(58) Field of Classification Search
CPC ... G06F 5/10; G06F 2205/106; G11C 7/1006; G11C 8/18
See application file for complete search history.

(56) References Cited

U.S. PATENT DOCUMENTS

| 6,597,627 | B2 | 7/2003 | Arata et al. |
| 7,205,792 | B2 | 4/2007 | Momtaz et al. |
| 2008/0031079 | A1 | 2/2008 | Osawa et al. |
| 2009/0016146 | A1* | 1/2009 | Fujisawa .............. G11C 7/22 365/233.1 |
| 2009/0180335 | A1* | 7/2009 | Chokkalingam ........ G11C 5/00 365/189.05 |
| 2013/0121100 | A1* | 5/2013 | Deivasigamani ... G06F 13/1689 365/233.11 |
| 2018/0164845 | A1* | 6/2018 | Christiansen ............. G06F 1/08 |

OTHER PUBLICATIONS

Taiwan Intellectual Property Office, "Office Action", dated Nov. 15, 2018.

* cited by examiner

*Primary Examiner* — Jerome Leboeuf
(74) *Attorney, Agent, or Firm* — Winston Hsu

(57) ABSTRACT

A FIFO circuit for a DDR memory system includes a pointer generator and a FIFO circuit. The FIFO circuit includes a pointer generator and a FIFO buffer. The pointer generator receives a first reset signal and a delay select signal from the memory controller. After the first reset signal is de-asserted, the pointer generator generates a write pointer according to a first reference clock and the pointer generator generates a read pointer according to a second reference clock. An input data is stored into the FIFO buffer according to the first reference clock and the write pointer. An output data is outputted from the FIFO buffer according to the second reference clock and the read pointer.

12 Claims, 8 Drawing Sheets

US 10,423,386 B1

FIFO CIRCUIT FOR DDR MEMORY SYSTEM

This application claims the benefit of Taiwan Patent Application No. 107115107, filed May 3, 2018, the subject matter of which is incorporated herein by reference.

FIELD OF THE INVENTION

The present invention relates to a circuit of a memory system, and more particularly to a first-in-first-out (FIFO) circuit for a double data rate (DDR) memory system.

BACKGROUND OF THE INVENTION

FIG. 1 is a schematic functional block diagram illustrating the architecture of a conventional DDR memory system. As shown in FIG. 1, the DDR memory system 100 comprises an application-specific integrated circuit (ASIC) 110 and a DDR memory 120.

The ASIC 110 comprises a memory controller 112 and a physical layer (PHY) circuit 114. The PHY circuit 114 of the ASIC 110 and the DDR memory 120 exchange various signals through a memory bus 122. A DDR PHY Interface 116, which is also referred as a DFI interface, is connected between the memory controller 112 and the PHY circuit 114. That is, plural signals are transmitted between the memory controller 112 and the PHY circuit 114 through the DFI interface 116.

The ASIC 110 further comprises a phase-locked loop (PLL) 118. The PLL 118 generates a DFI clock (DFIclk) to the memory controller 112 and the PHY circuit 114. Consequently, the memory controller 112 and the PHY circuit 114 are operated in the same DFI clock domain.

The PHY circuit 114 further comprises a data physical layer circuit (Data0 PHY) 131, a data physical layer circuit (Data1 PHY) 132 and a command physical layer circuit (CMD PHY) circuit 133. Of course, the PHY circuit 114 of the ASIC 110 may comprise more than two data physical layer circuits. As the data amount increases, the number of the data physical layer circuit increases.

When the memory controller 112 intends to store a write data into the DDR memory 120, the memory controller 112 generates a write command and the write data. The write command is transmitted from the memory controller 112 to the CMD PHY circuit 133 through the DFI interface 116. In addition, the write command is transmitted from the CMD PHY circuit 133 to the DDR memory 120 through the memory bus 122. The write data is transmitted from the memory controller 112 to the two data physical layers 131 and 132 through the DFI interface 116. In addition, the write data is transmitted from the two data physical layers 131 and 132 to the DDR memory 120 through the memory bus 122. Consequently, the write data is stored into the DDR memory 120 according to the write command.

When the memory controller 112 intends to acquire a read data from the DDR memory 120, the memory controller 112 generates a read command. The read command is transmitted from the memory controller 112 to the CMD PHY circuit 133 through the DFI interface 116. In addition, the read command is transmitted from the CMD PHY circuit 133 to the DDR memory 120 through the memory bus 122. Moreover, the DDR memory 120 generates the read data according to the read command. The read data is transmitted from the DDR memory 120 to the two data physical layers 131 and 132 through the memory bus 122. In addition, the read data is transmitted from the two data physical layers 131 and 132 to the memory controller 112 through the DFI interface 116.

As mentioned above, the CMD PHY circuit 133 transfers the command in one direction, and the two data physical layers 131 and 132 transfer data in two directions.

According to the specifications of the DDR memory 120, the write command and the write data are transferred according to a specified timing sequence relationship. After the memory controller 112 transfers the write command and the write data to the PHY circuit 114 according to a specified timing sequence relationship, the PHY circuit 114 transfers the write command and the write data to the DDR memory 120 according to the specified timing sequence relationship. Similarly, the read command and the read data are transferred according to the specified timing sequence relationship.

The memory controller 112, the PHY circuit 114 and the DFI interface 116 in the ASIC 110 are operated to transfer various signals according to the DFI clock (DFIclk). Consequently, the DDR memory controller 112 and PHY circuit 114 have to perform the clock tree balance from a DFI clock tree root.

In practice, the CMD PHY circuit 133 and the data physical layers 131 and 132 are allocated at different positions of the ASIC 110. In other words, it is almost impossible to design the suitable DFI clock tree root.

Consequently, after the memory controller 112 transfers the write command and the write data according to the specified timing sequence relationship, the write command and the write data received by the PHY circuit 114 are not maintained according to the specified timing sequence relationship. Consequently, the write data or the read data is possibly lost or the DDR memory 120 is erroneously operated.

SUMMARY OF THE INVENTION

An embodiment of the present invention provides a FIFO circuit. The FIFO circuit includes a pointer generator and a FIFO buffer. The pointer generator receives a first reset signal and a delay select signal from the memory controller. After the first reset signal is de-asserted, the pointer generator generates a write pointer according to a first reference clock and the pointer generator generates a read pointer according to a second reference clock and the delay select signal. An input data is stored into the FIFO buffer according to the first reference clock and the write pointer. An output data is outputted from the FIFO buffer according to the second reference clock and the read pointer.

Another embodiment of the present invention provides a double data rate memory system. The double data rate memory system includes a double data rate memory and an application-specific integrated circuit. The application-specific integrated circuit is connected with the double data rate memory. The application-specific integrated circuit includes a FIFO circuit. The FIFO circuit is connected between a memory controller and a physical layer circuit. The FIFO circuit includes a pointer generator and a FIFO buffer. The pointer generator receives a first reset signal and a delay select signal from the memory controller. After the first reset signal is de-asserted, the pointer generator generates a write pointer according to a first reference clock and the pointer generator generates a read pointer according to a second reference clock and the delay select signal. An input data is stored into the FIFO buffer according to the first reference clock and the write pointer. An output data is outputted from the FIFO buffer according to the second reference clock and the read pointer.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
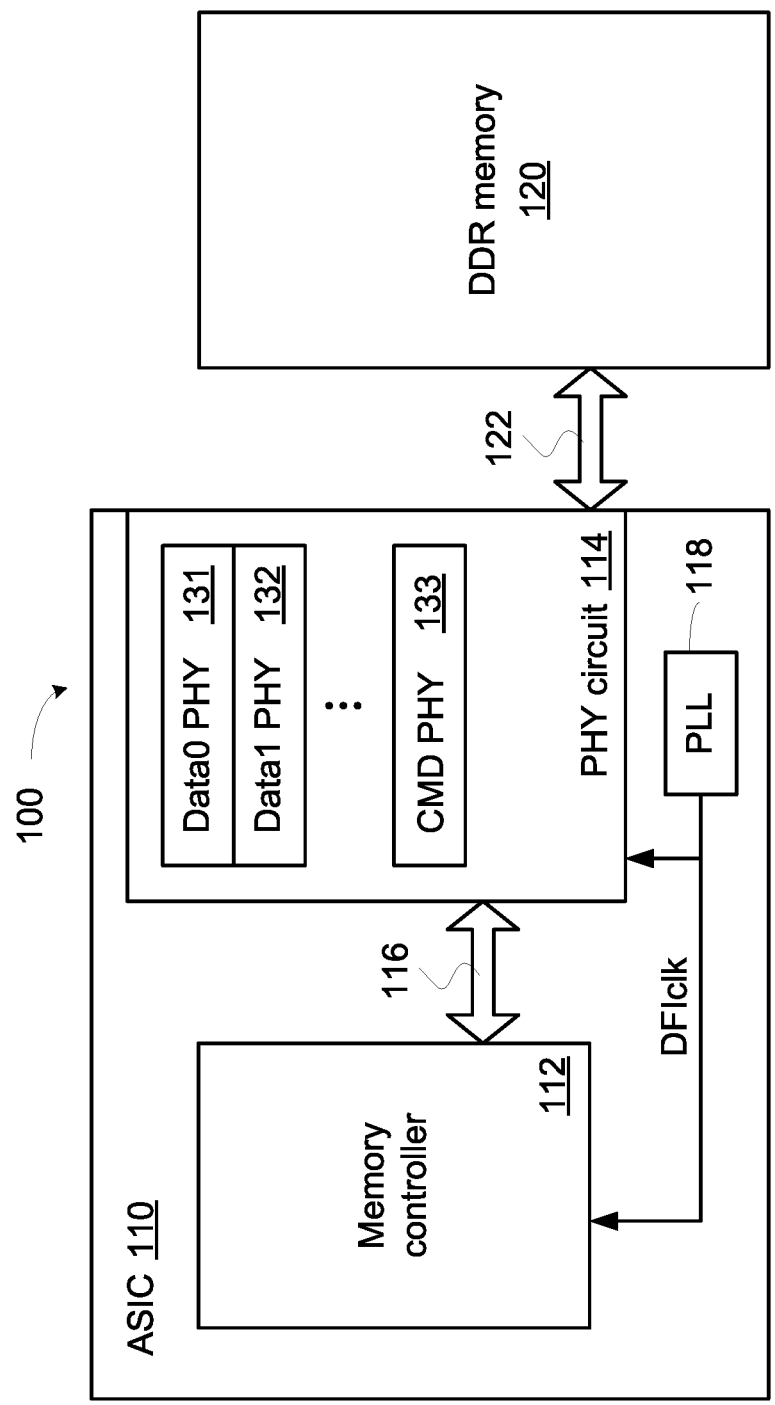
FIG. 1 (prior art) is a schematic functional block diagram illustrating the architecture of a conventional DDR memory system.
Figure 2:
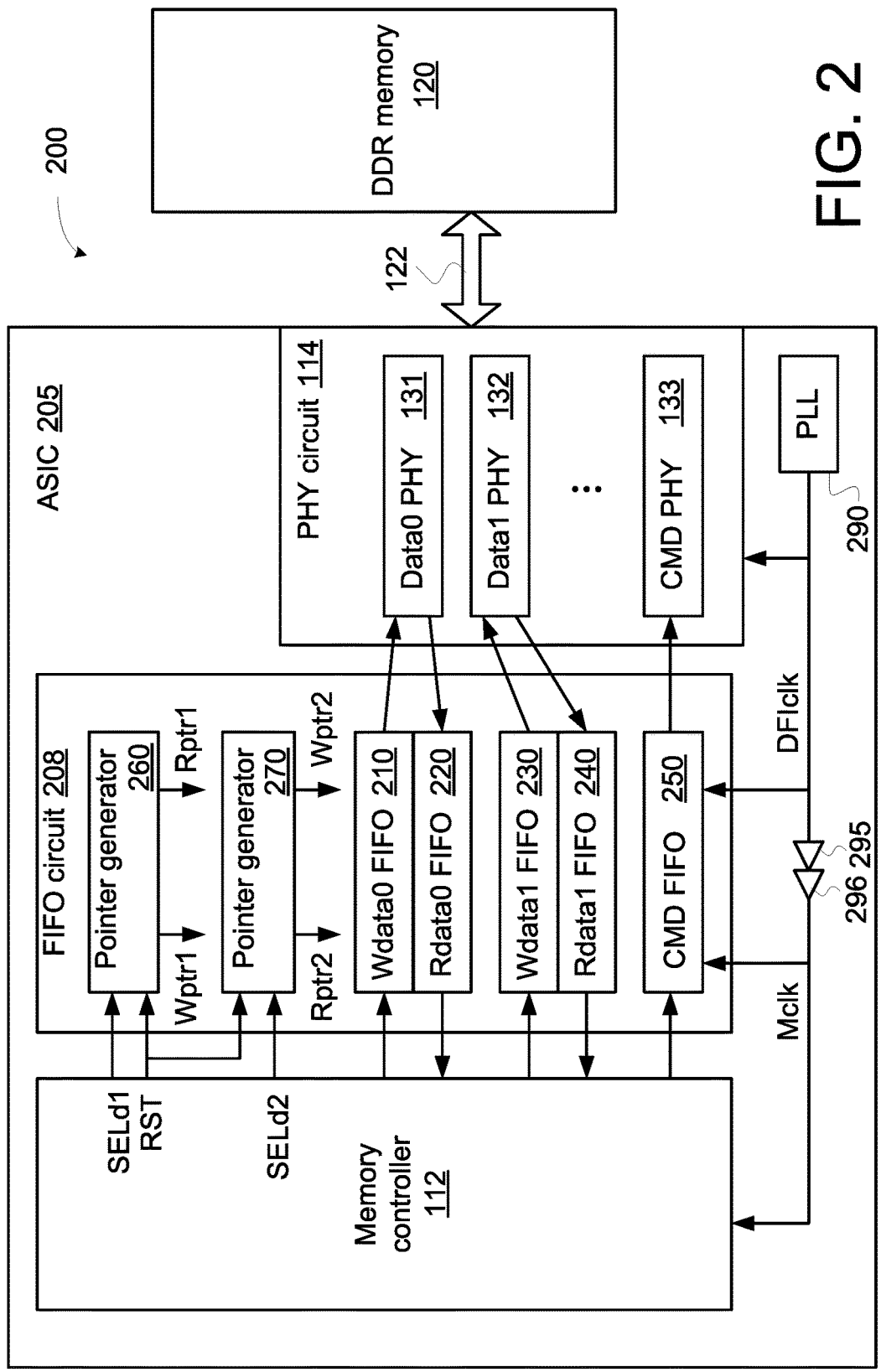
FIG. 2 is a schematic functional block diagram illustrating the architecture of a DDR memory system according to an embodiment of the present invention.

FIG. 2 is a schematic functional block diagram illustrating the architecture of a DDR memory system according to an embodiment of the present invention. As shown in FIG. 2, the DDR memory system 200 comprises an ASIC 205 and a DDR memory 120.

The ASIC 205 comprises a memory controller 112, a first-in-first-out (FIFO) circuit 208 and a physical layer (PHY) circuit 114. The PHY circuit 114 of the ASIC 205 and the DDR memory 120 exchange various signals through a memory bus 122.

The PHY circuit 114 further comprises a data physical layer circuit (Data0 PHY) 131, a data physical layer circuit (Data1 PHY) 132 and a command physical layer circuit (CMD PHY) circuit 133. Of course, the PHY circuit 114 of the ASIC 110 may comprise more than two data physical layer circuits. As the data amount increases, the number of the data physical layer circuit increases.

The ASIC 205 further comprises a phase-locked loop (PLL) 290. The PLL 290 generates a DFI clock (DFIclk) to the memory controller 112. After the DFI clock (DFIclk) is processed by plural clock buffers 295 and 296, a main clock (Mclk) is generated. In other words, the main clock (Mclk) and the DFI clock (DFIclk) have the same frequency but have different phases.

The FIFO circuit 208 comprises a pointer generator 260, a pointer generator 270, a write data FIFO buffer (Wdata0 FIFO) 210, a write data FIFO buffer (Wdata1 FIFO) 230, a read data FIFO butter (Rdata0 FIFO) 220, a read data FIFO butter (Rdata1 FIFO) 240 and a command FIFO buffer (CMD FIFO) 250.

The memory controller 112 controls the FIFO circuit 208 according to a reset signal RST. When the reset signal RST is asserted, the FIFO circuit 208 is in a reset state. In the reset state, the FIFO circuit 208 is disabled.

When the reset signal RST is de-asserted, the FIFO circuit 208 is enabled. Meanwhile, the pointer generator 260 of the FIFO circuit 208 generates a write pointer Wptr1 and generates a read pointer Rptr1 according to a delay select signal SELd1. Consequently, the operations of the write data FIFO buffer (Wdata0 FIFO) 210, the write data FIFO buffer (Wdata1 FIFO) 230 and the command FIFO buffer (CMD FIFO) 250 are controlled. Moreover, the pointer generator 270 of the FIFO circuit 208 generates a write pointer Wptr2 and generates a read pointer Rptr2 according to a delay select signal SELd2. Consequently, the operations of the read data FIFO butter (Rdata0 FIFO) 220 and the read data FIFO butter (Rdata1 FIFO) 240 are controlled.

In an embodiment, the PHY circuit 114 is operated according to the DFI clock (DFIclk). That is, the PHY circuit 114 is operated in the DFI clock domain. The memory controller 112 is operated according to the main clock (Mclk). That is, the memory controller 112 is operated in the main clock domain.

A portion of the FIFO circuit 208 is operated according to the main clock (Mclk). Another portion of the FIFO circuit 208 is operated according to the DFI clock (DFIclk). In other words, the FIFO circuit 208 exchanges data between the main clock domain and the DFI clock domain.

When the memory controller 112 intends to store a write data into the DDR memory 120, the memory controller 112 generates a write command and the write data according to the main clock (Mclk). Moreover, according to the main clock (Mclk), the write command is inputted into the command FIFO buffer (CMD FIFO) 250, and the write data is inputted into the write data FIFO buffer (Wdata0 FIFO) 210 and the write data FIFO buffer (Wdata1 FIFO) 230.

Then, according to the DFI clock (DFIclk), the write command is outputted from the command FIFO buffer (CMD FIFO) 250 and the write data is outputted from the write data FIFO buffer (Wdata0 FIFO) 210 and the write data FIFO buffer (Wdata1 FIFO) 230. Then, the write command is transmitted to the command physical layer circuit (CMD PHY) circuit 133 of the PHY circuit 114, and the write data is transmitted to the data physical layer circuit (Data0 PHY) 131 and the data physical layer circuit (Data1 PHY) 132 of the PHY circuit 114. Then, the write command is transmitted from the CMD PHY circuit 133 to the DDR memory 120 through the memory bus 122. In addition, the write data is transmitted from the two data physical layers 131 and 132 to the DDR memory 120 through the memory bus 122. Consequently, the write data is stored into the DDR memory 120 according to the write command.

When the memory controller 112 intends to acquire a read data from the DDR memory 120, the memory controller 112 generates a read command according to the main clock (Mclk). The read command is inputted into the command FIFO buffer (CMD FIFO) 250. Then, according to the DFI clock (DFIclk), the read command is outputted from the command FIFO buffer (CMD FIFO) 250 to the CMD PHY circuit 133 to the DDR memory 120. Then, the read command is transmitted from the CMD PHY circuit 133 to the DDR memory 120 through the memory bus 122.

Moreover, the DDR memory 120 generates the read data according to the read command. The read data is transmitted from the DDR memory 120 to the two data physical layers 131 and 132 through the memory bus 122. Then, according to the DFI clock (DFIclk), the read data is transmitted from the two data physical layers 131 and 132 to the read data FIFO butter (Rdata0 FIFO) 220 and the read data FIFO butter (Rdata1 FIFO) 240. Then, according to the main clock (Mclk), the read data is transmitted from the read data FIFO butter (Rdata0 FIFO) 220 and the read data FIFO butter (Rdata1 FIFO) 240 to the memory controller 112.

The pointer generator 260 is used for controlling the write data FIFO buffer (Wdata0 FIFO) 210, the write data FIFO buffer (Wdata1 FIFO) 230 and the command FIFO buffer (CMD FIFO) 250. The pointer generator 270 is used for controlling the read data FIFO butter (Rdata0 FIFO) 220 and the read data FIFO butter (Rdata1 FIFO) 240. The circuits and operations of the pointer generator 260, the write data FIFO buffer (Wdata0 FIFO) 210, the write data FIFO buffer (Wdata1 FIFO) 230 and the command FIFO buffer (CMD FIFO) 250 will be described as follows.

Figure 3A:
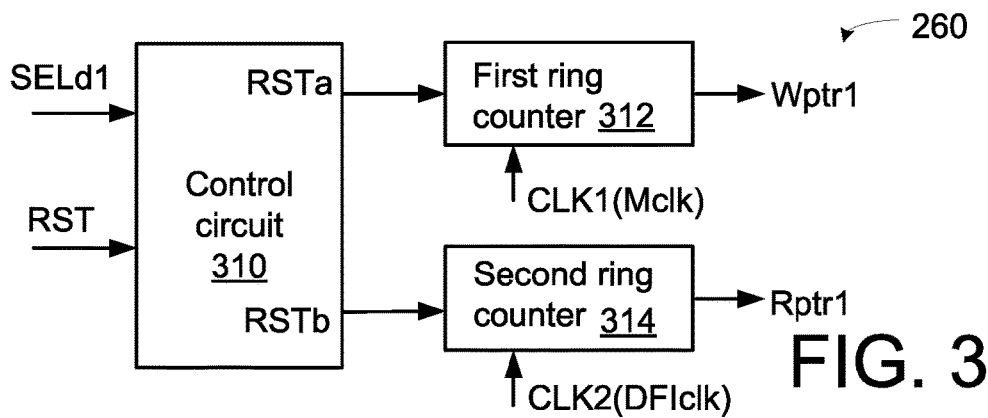
FIG. 3A is a schematic functional block diagram illustrating the pointer generator 260 of the DDR memory system according to the embodiment of the present invention.
Figure 3B:
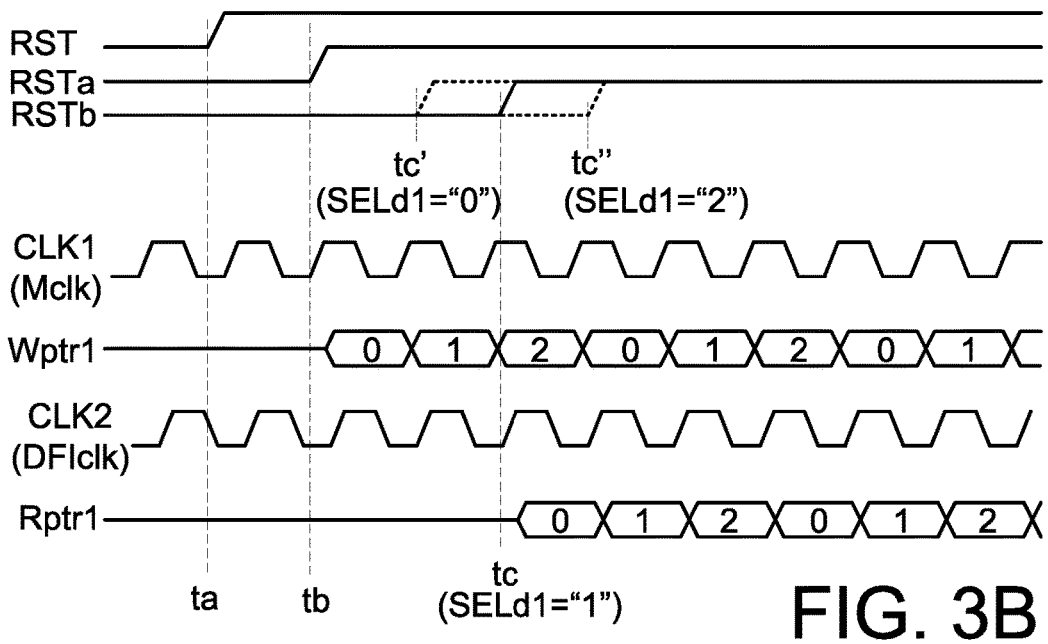
FIG. 3B is a schematic timing waveform diagram illustrating associated signals processed by the pointer generator of FIG. 3A.

FIG. 3A is a schematic functional block diagram illustrating the pointer generator 260 of the DDR memory system according to the embodiment of the present invention. FIG. 3B is a schematic timing waveform diagram illustrating associated signals processed by the pointer generator of FIG. 3A. The pointer generator 260 comprises a control circuit 310, a first ring counter 312 and a second ring counter 314. The control circuit 310 receives the reset signal RST and the delay select signal SELd1. Moreover, the control circuit 310 issues reset signals RSTa and RSTb to the first ring counter 312 and the second ring counter 314, respectively. The first ring counter 312 generates the write pointer Wptr1 according to a first reference clock CLK1. The second ring counter 314 generates the read pointer Rptr1 according to a second reference clock CLK2.

When the memory controller 112 generates a write command, a read command or a write data to the DDR memory 120, the first reference clock CLK1 is the main clock (Mclk) and the second reference clock CLK2 is the DFI clock (DFIclk).

In case that the reset signal RST is asserted, the reset signals RSTa and RSTb are also asserted by the control circuit 310. Consequently, the first ring counter 312 and the second ring counter 314 do not start counting. In case that the reset signal RST is de-asserted, the reset signal RSTa is firstly de-asserted by the control circuit 310 and then the reset signal RSTb is de-asserted by the control circuit 310 according to the delay select signal SELd1. Consequently, the first ring counter 312 and the second ring counter 314 start counting. In addition, the first ring counter 312 generates the write pointer Wptr1, and the second ring counter 314 generates the read pointer Rptr1.

Please refer to FIG. 3B. Before the time point ta, the reset signal RST is asserted (i.e., in a low level state). Since the reset signals RSTa and RSTb are also asserted (i.e., in the low level state), the first ring counter 312 and the second ring counter 314 do not start counting.

At the time point ta, the reset signal RST is de-asserted (i.e., in a high level state). Consequently, the reset signal RSTa is de-asserted by the control circuit 310 at the time point tb, and the reset signal RSTb is de-asserted by the control circuit 310 at the time point tc. The time point tc of de-asserting the reset signal RSTb is after the time point tb of de-asserting the reset signal RSTa. Moreover, the time point of de-asserting the reset signal RSTb may be adjusted according to the delay select signal SELd1.

Please refer to FIG. 3B. In case that the delay select signal SELd1 is "1" (i.e., SELd1="1"), the delay select signal SELd1 is de-asserted at the time point tc. In case that the delay select signal SELd1 is "0" (i.e., SELd1="0"), the delay select signal SELd1 is de-asserted at the time point tc'. The time difference between the time point tc' and the time point tc is equal to one cycle of the second clock CLK2. In case that the delay select signal SELd1 is "2" (i.e., SELd1="2"), the delay select signal SELd1 is de-asserted at the time point tc". The time difference between the time point tc and the time point tc" is equal to one cycle of the second clock CLK2. In the following example, the reset signal RSTb is de-asserted by the control circuit 310 at the time point tc.

After the reset signal RSTa is de-asserted at the time point tb, the first ring counter 312 cyclically counts from 0 to 2 and generates the write pointer Wptr1 according to the main clock (Mclk). After the reset signal RSTb is de-asserted at the time point tc, the second ring counter 314 cyclically counts from 0 to 2 and generates the read pointer Rptr1 according to the DFI clock (DFIclk).

As mentioned above, the pointer generator 260 receives the reset signal RST and the delay select signal SELd1 from the memory controller 112. When the reset signal RST is de-asserted, the pointer generator 260 generates the write pointer Wptr1 according to the first reference clock CLK1 and the pointer generator 260 generates the read pointer Rptr1 according to the second reference clock CLK2 and the delay select signal SELd1.

Figure 3C:
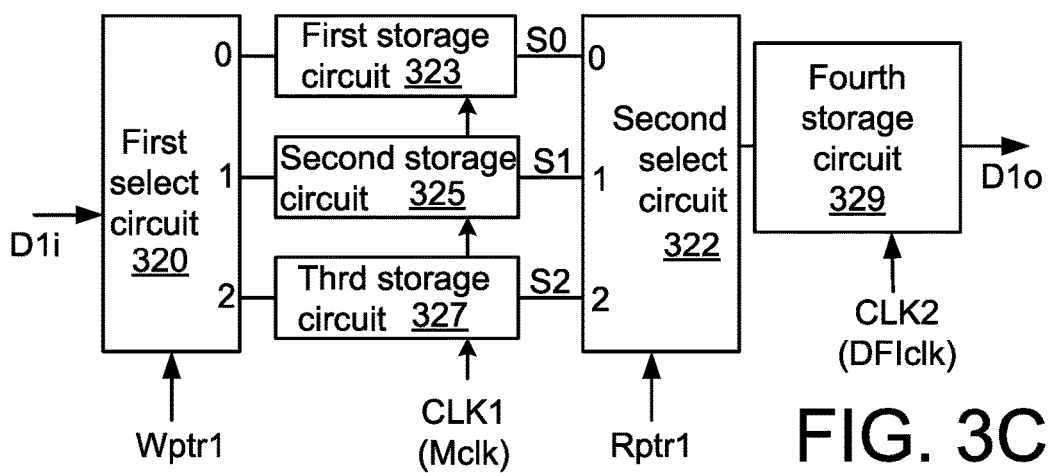
FIG. 3C is a schematic functional block diagram illustrating the FIFO buffer of the write data FIFO circuit of the DDR memory system according to the embodiment of the present invention.
Figure 3D:
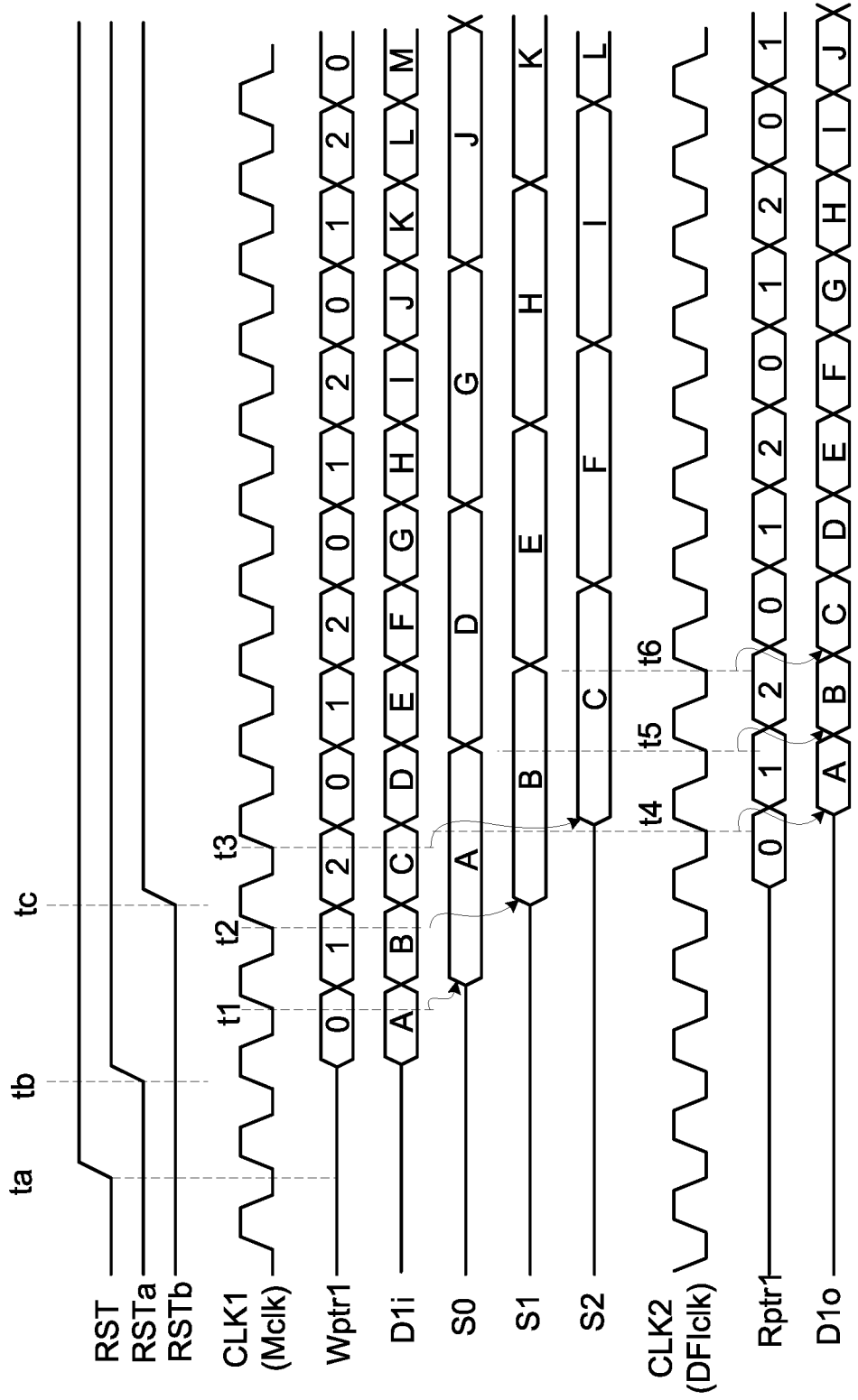
FIG. 3D is a schematic timing waveform diagram illustrating associated signals processed by the FIFO buffer of FIG. 3C.

FIG. 3C is a schematic functional block diagram illustrating the write data FIFO buffer of the FIFO circuit of the DDR memory system according to the embodiment of the present invention. FIG. 3D is a schematic timing waveform diagram illustrating associated signals processed by the FIFO buffer of FIG. 3C. The FIFO buffer is the write data FIFO buffer (Wdata0 FIFO) 210, the write data FIFO buffer (Wdata1 FIFO) 230 or the command FIFO buffer (CMD FIFO) 250.

The FIFO buffer comprises a first select circuit 320, a second select circuit 322, a first storage circuit 323, a second storage circuit 325, a third storage circuit 327 and a fourth storage circuit 329. The first storage circuit 323, the second storage circuit 325 and the third storage circuit 327 are operated according to the first reference clock CLK1. The fourth storage circuit 329 is operated according to the second reference clock CLK2.

The first select circuit 320 receives a data signal D1$i$ and the write pointer Wptr1. Moreover, the first select circuit 320 is connected with the input terminals of the first storage circuit 323, the second storage circuit 325 and the third storage circuit 327. According to the value of the write pointer Wptr1, the first select circuit 320 outputs the data signal D1$i$ to a corresponding storage circuit of the first storage circuit 323, the second storage circuit 325 and the third storage circuit 327. The data signal D1$i$ is a command signal or the write data.

The second select circuit 322 is connected with the output terminals S0, S1 and S2 of the first storage circuit 323, the second storage circuit 325 and the third storage circuit 327, respectively. Moreover, the second select circuit 322 is connected with the input terminal of the fourth storage circuit 329. According to the value of the read pointer Rptr1, the data from one of the output terminals S0, S1 and S2 of the first storage circuit 323, the second storage circuit 325 and the third storage circuit 327 is outputted from the second select circuit 322 to the fourth storage circuit 329. Consequently, the fourth storage circuit 329 generates a data signal D1$o$.

Please refer to FIG. 3D. The operations of the reset signals RST, RSTa, RSTb, the write pointer Wptr1 and the read pointer Rptr1 of FIG. 3D are similar to those of FIG. 3B, and are not redundantly described herein.

At the time point t1 corresponding to a rising edge of the main clock (Mclk), the value of the write pointer Wptr1 is "0" and the content of the data signal D1$i$ is "A". Consequently, the content "A" of the data signal D1$i$ is transmitted to the first storage circuit 323. That is, the output signal S0 of the first storage circuit 323 is "A". As shown in FIG. 3D, the write pointer Wptr1 is restored to "0" again after three cycles of the main clock (Mclk). Meanwhile, the content "A" of the data signal D1$i$ in the first storage circuit 323 is replaced by the content "D". The rest may be deduced by analogy.

At the time point t2 corresponding to a rising edge of the main clock (Mclk), the value of the write pointer Wptr1 is "1" and the content of the data signal D1$i$ is "B". Consequently, the content "B" of the data signal D1$i$ is transmitted to the second storage circuit 325. That is, the output signal S1 of the second storage circuit 325 is "B". As shown in FIG. 3D, the write pointer Wptr1 is restored to "1" again after three cycles of the main clock (Mclk). Meanwhile, the content "B" of the data signal D1$i$ in the second storage circuit 325 is replaced by the content "E". The rest may be deduced by analogy.

At the time point t3 corresponding to a rising edge of the main clock (Mclk), the value of the write pointer Wptr1 is "2" and the content of the data signal D1$i$ is "C". Consequently, the content "C" of the data signal D1$i$ is transmitted to the third storage circuit 327. That is, the output signal S2 of the third storage circuit 327 is "C". As shown in FIG. 3D, the write pointer Wptr1 is restored to "2" again after three cycles of the main clock (Mclk). Meanwhile, the content "F" of the data signal D1$i$ in the third storage circuit 327 is replaced by the content "E". The rest may be deduced by analogy.

As mentioned above, the data valid time of the output signals S0, S1 and S2 from the storage circuits 323, 324 and 325 is equal to three cycles of the main clock (Mclk).

At the time point t4 corresponding to a rising edge of the DFI clock (DFIclk), the value of the read pointer Rptr1 is "0" and the output signal S0 of the first storage circuit 323 is "A". Consequently, the content "A" of the output signal S0 of the first storage circuit 323 is transmitted to the fourth storage circuit 329. That is, the data signal D1$o$ of the fourth storage circuit 329 is "A".

At the time point t5 corresponding to a rising edge of the DFI clock (DFIclk), the value of the read pointer Rptr1 is "1" and the output signal S1 of the second storage circuit 325 is "B". Consequently, the content "B" of the output signal S1 of the second storage circuit 325 is transmitted to the fourth storage circuit 329. That is, the data signal D1$o$ of the fourth storage circuit 329 is "B".

At the time point t6 corresponding to a rising edge of the DFI clock (DFIclk), the value of the read pointer Rptr1 is "2" and the output signal S2 of the third storage circuit 327 is "C". Consequently, the content "C" of the output signal S2 of the third storage circuit 327 is transmitted to the fourth storage circuit 329. That is, the data signal D1$o$ of the fourth storage circuit 329 is "C". The rest may be deduced by analogy. In other words, the data signals D1$o$ of the fourth storage circuit 329 are sequentially D", "E", "F", and so on.

From the above descriptions, the data signal D1$o$ and the DFI clock (DFIclk) are synchronized because the fourth storage circuit 329 is operated according to the DFI clock (DFIclk). In other words, the FIFO circuit 208 exchanges data between the main clock domain and the DFI clock domain. Consequently, a specified timing sequence relationship between the write command and the write data can be maintained.

The structure of the pointer generator 270 is identical to the structure of the pointer generator 260. However, the signals received by the pointer generator 270 are different from the signals received by the pointer generator 260. The FIFO buffers 210, 220, 230, 240 and 250 have the same structure. Hereinafter, the connecting relationships between the pointer generator 270, the read data FIFO butter (Rdata0 FIFO) 220 and the read data FIFO butter (Rdata1 FIFO) 240 will be described as follows. For succinctness, the operations of these components are omitted.

Figure 4A:
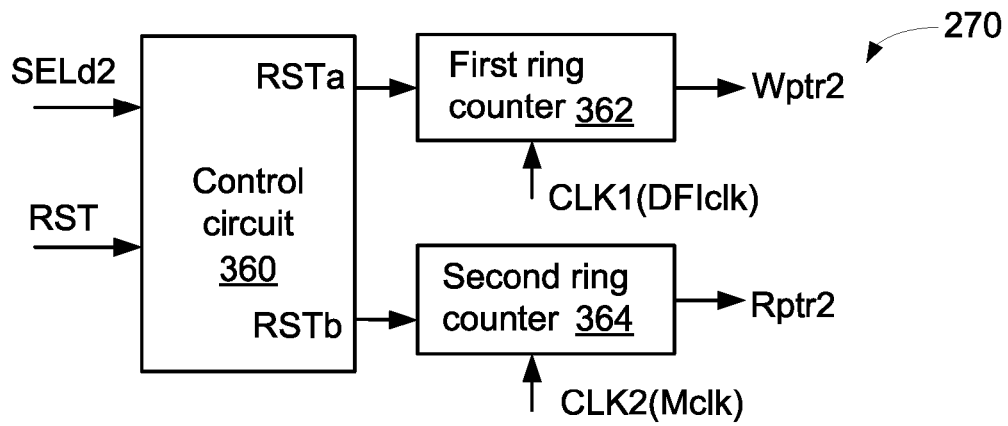
FIG. 4A is a schematic functional block diagram illustrating the pointer generator 270 of the DDR memory system according to the embodiment of the present invention.

FIG. 4A is a schematic functional block diagram illustrating the pointer generator 270 of the DDR memory system according to the embodiment of the present invention. The pointer generator 270 is used for controlling the read data FIFO butter (Rdata0 FIFO) 220 and the read data FIFO butter (Rdata1 FIFO) 240.

In comparison with the pointer generator 260, the first reference clock CLK1 and the second reference clock CLK2 of the pointer generator 270 are the DFI clock (DFIclk) and the main clock (Mclk), respectively.

The pointer generator 270 comprises a control circuit 360, a first ring counter 362 and a second ring counter 364. The control circuit 310 receives the reset signal RST and the delay select signal SELd2. Moreover, the control circuit 360 issues the reset signals RSTa and RSTb to the first ring counter 362 and the second ring counter 364, respectively. The first ring counter 362 generates the write pointer Wptr2 according to the first reference clock CLK1. The second ring counter 364 generates the read pointer Rptr2 according to the second reference clock CLK2.

Figure 4B:
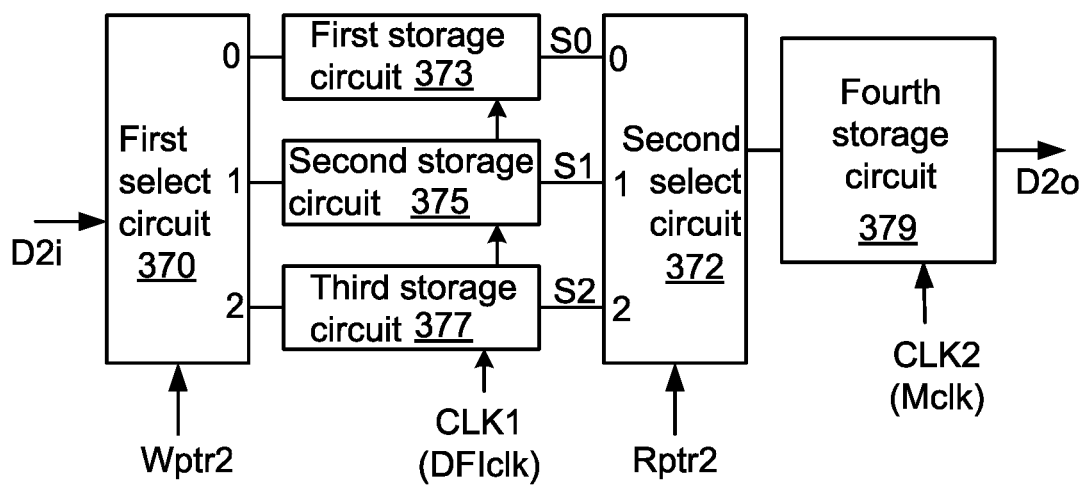
FIG. 4B is a schematic functional block diagram illustrating the FIFO buffer of the read data FIFO circuit of the DDR memory system according to the embodiment of the present invention.

FIG. 4B is a schematic functional block diagram illustrating the read data FIFO buffer of the FIFO circuit of the DDR memory system according to the embodiment of the present invention. The read data FIFO buffer is the read data FIFO butter (Rdata0 FIFO) 220 or the read data FIFO butter (Rdata1 FIFO) 240.

FIFO buffer comprises a first select circuit 370, a second select circuit 372, a first storage circuit 373, a second storage circuit 375, a third storage circuit 377 and a fourth storage circuit 379. The first storage circuit 373, the second storage circuit 375 and the third storage circuit 377 are operated according to the first reference clock CLK1. The fourth storage circuit 379 is operated according to the second reference clock CLK2.

The first select circuit 370 receives a data signal D2*i* and the write pointer Wptr2. Moreover, the first select circuit 370 is connected with the input terminals of the first storage circuit 373, the second storage circuit 375 and the third storage circuit 377. According to the value of the write pointer Wptr2, the first select circuit 370 outputs the data signal D2*i* to a corresponding storage circuit of the first storage circuit 373, the second storage circuit 375 and the third storage circuit 377. The data signal D2*i* is a read data.

The second select circuit 372 is connected with the output terminals S0, S1 and S2 of the first storage circuit 373, the second storage circuit 375 and the third storage circuit 377, respectively. Moreover, the second select circuit 372 is connected with the input terminal of the fourth storage circuit 379. According to the value of the read pointer Rptr2, the data from one of the output terminals S0, S1 and S2 of the first storage circuit 373, the second storage circuit 375 and the third storage circuit 377 is outputted from the second select circuit 372 to the fourth storage circuit 379. Consequently, the fourth storage circuit 379 generates a data signal D2*o*.

Figure 5A:
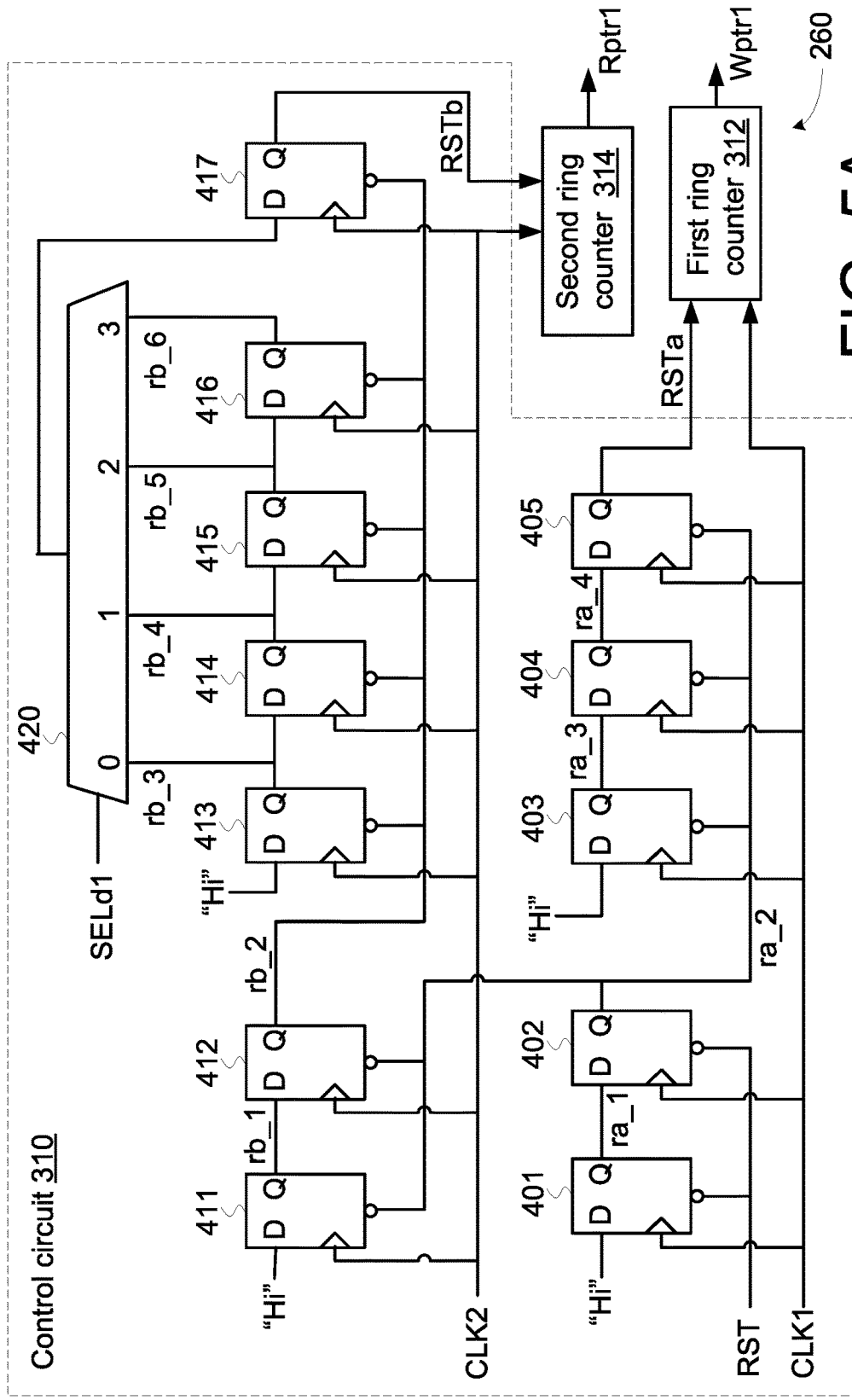
FIG. 5A is a schematic circuit diagram illustrating the pointer generator of the DDR memory system according to the embodiment of the present invention.
Figure 5B:
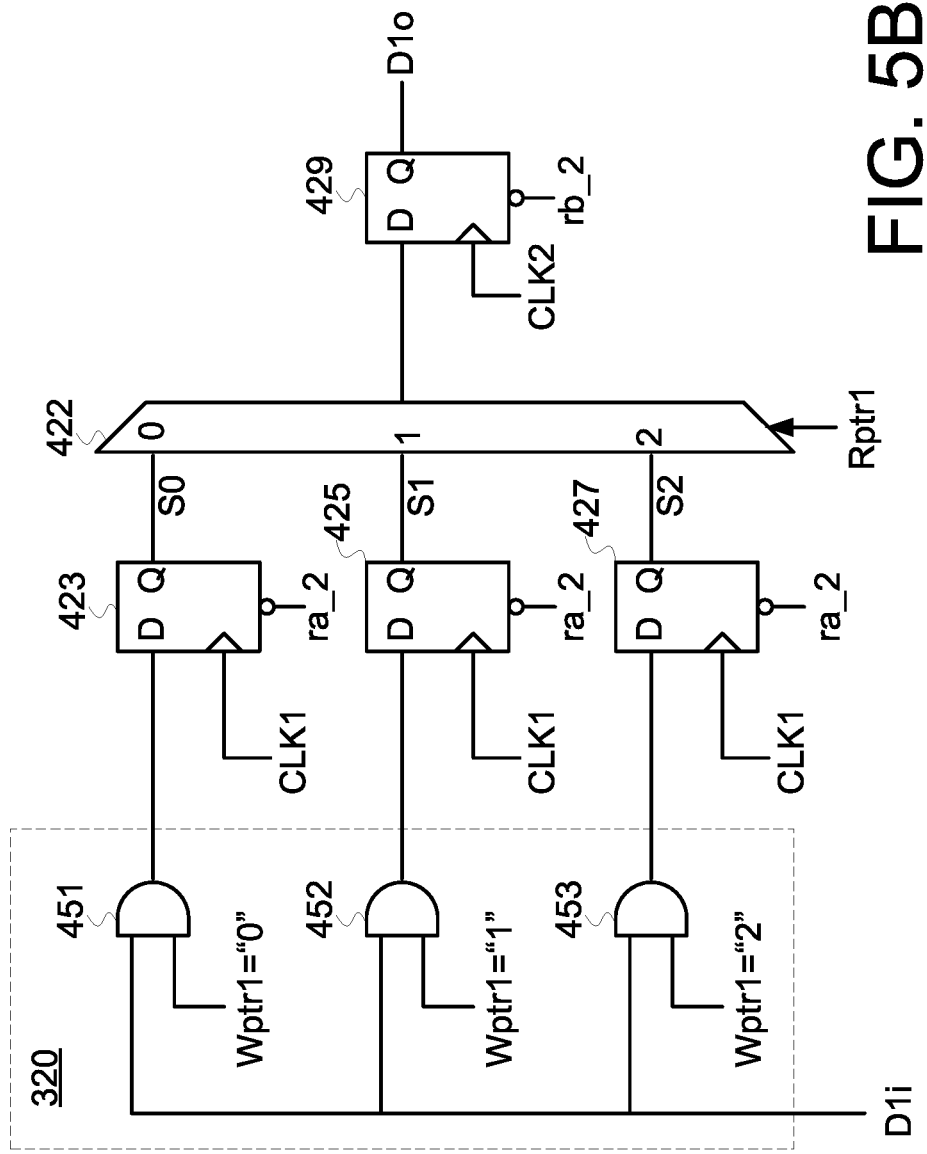
FIG. 5B is a schematic circuit diagram illustrating the FIFO buffer of the FIFO circuit of the DDR memory system according to the embodiment of the present invention.
Figure 5C:
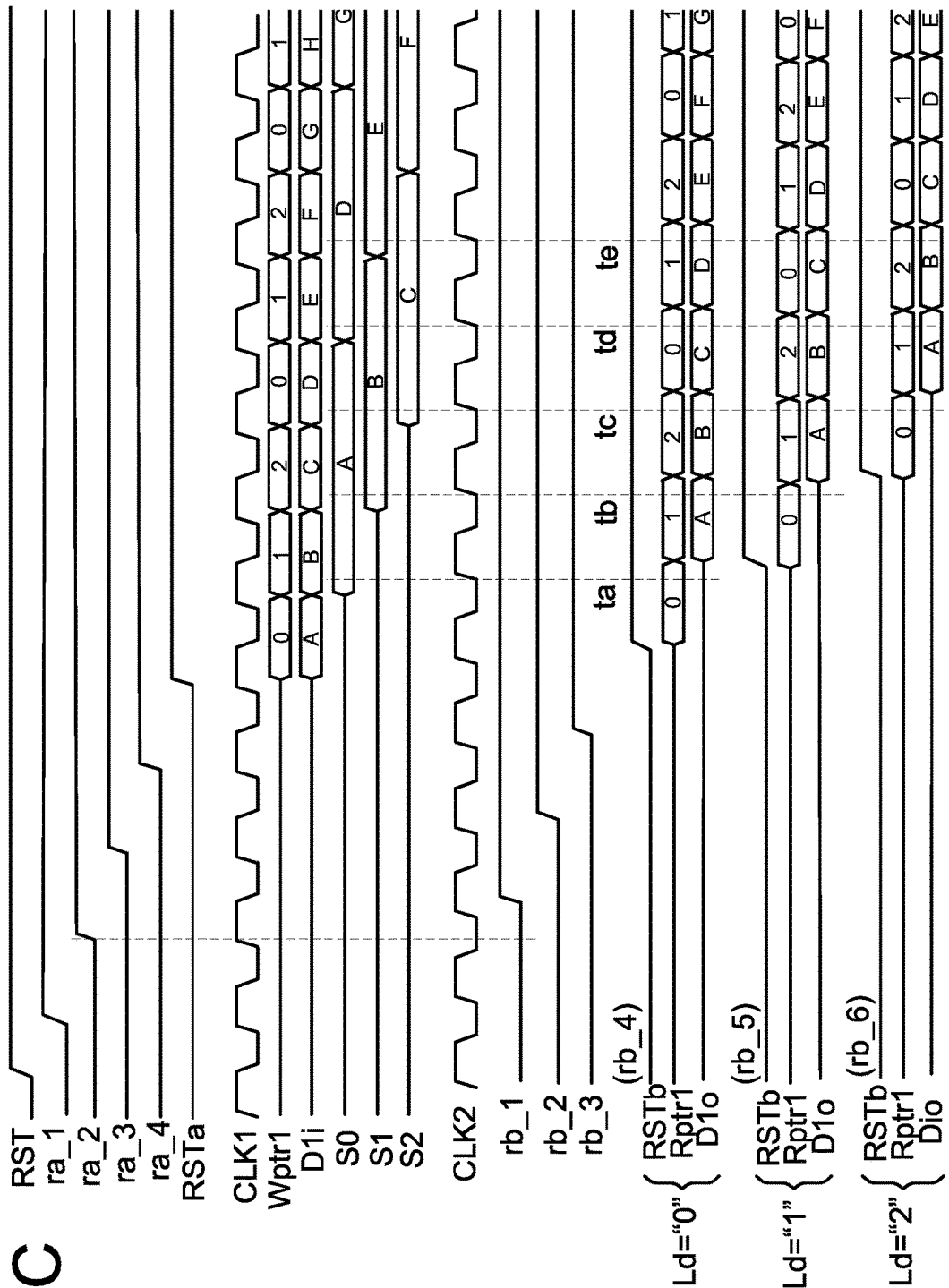
FIG. 5C is a schematic timing waveform diagram illustrating associated signals processed by the pointer generator of FIG. 5A.

FIG. 5A is a schematic circuit diagram illustrating the pointer generator of the DDR memory system according to the embodiment of the present invention. FIG. 5B is a schematic circuit diagram illustrating the FIFO buffer of the FIFO circuit of the DDR memory system according to the embodiment of the present invention. FIG. 5C is a schematic timing waveform diagram illustrating associated signals processed by the pointer generator of FIG. 5A. For illustration, the pointer generator is the pointer generator 260, and the FIFO buffer is the write data FIFO buffer (Wdata0 FIFO) 210, the write data FIFO buffer (Wdata1 FIFO) 230 or the command FIFO buffer (CMD FIFO) 250. The structure and function of the pointer generator 270 are similar to those of the pointer generator 260. The structure and function of the read data FIFO butter (Rdata0 FIFO) 220 and the read data FIFO butter (Rdata1 FIFO) 240 are similar to those of the write data FIFO buffer (Wdata0 FIFO) 210, the write data FIFO buffer (Wdata1 FIFO) 230 and the command FIFO buffer (CMD FIFO) 250. For succinctness, the operations of these components are omitted.

The above circuits are presented herein for purpose of illustration and description only. It is noted that numerous modifications and alterations of the pointer generator and the FIFO buffer may be made while retaining the teachings of the invention.

As shown in FIG. 5A, the control circuit 310 of the pointer generator 260 comprises plural D type flip-flops 401~417 and a multiplexer 420. The clock input terminals of the D type flip-flops 401~405 receive the first clock CLK1. The clock input terminals of the D type flip-flops 411~417 receive the second clock CLK2. The first reference clock CLK1 is the main clock (Mclk). The second reference clock CLK2 is the DFI clock (DFIclk).

The reset terminals of the D type flip-flops 401 and 402 receive the reset signal RST. The input terminal of the D type flip-flop 401 receives a high voltage level "Hi". The output terminal of the D type flip-flop 401 issues a reset signal ra_1. The input terminal of the D type flip-flop 402 receives the reset signal ra_1. The output terminal of the D type flip-flop 402 issues a reset signal ra_2.

The reset terminals of the D type flip-flops 403, 404 and 405 receive the reset signal ra_2. The input terminal of the D type flip-flop 403 receives the high voltage level "Hi". The output terminal of the D type flip-flop 403 issues a reset signal ra_3. The input terminal of the D type flip-flop 404 receives the reset signal ra_3. The output terminal of the D type flip-flop 404 issues a reset signal ra_4. The input terminal of the D type flip-flop 405 receives the reset signal ra_4. The output terminal of the D type flip-flop 405 issues the reset signal RSTa.

The reset terminals of the D type flip-flops 411 and 412 receive the reset signal ra_2. The input terminal of the D type flip-flop 411 receives the high voltage level "Hi". The output terminal of the D type flip-flop 411 issues a reset signal rb_1. The input terminal of the D type flip-flop 412 receives the reset signal rb_1. The output terminal of the D type flip-flop 412 issues a reset signal rb_2.

The reset terminals of the D type flip-flops 413, 414, 415, 416 and 417 receive the reset signal rb_2. The input terminal of the D type flip-flop 413 receives the high voltage level "Hi". The output terminal of the D type flip-flop 413 issues a reset signal rb_3. The input terminal of the D type flip-flop 414 receives the reset signal rb_3. The output terminal of the D type flip-flop 414 issues a reset signal rb_4. The input terminal of the D type flip-flop 415 receives the reset signal rb_4. The output terminal of the D type flip-flop 415 issues a reset signal rb_5. The input terminal of the D type flip-flop 416 receives the reset signal rb_5. The output terminal of the D type flip-flop 416 issues a reset signal rb_6.

The select terminal of the multiplexer 420 receives the delay select signal SELd1. The first input terminal of the multiplexer 420 receives the reset signal rb_3. The second input terminal of the multiplexer 420 receives the reset signal rb_4. The third input terminal of the multiplexer 420 receives the reset signal rb_5. The fourth input terminal of the multiplexer 420 receives the reset signal rb_6. According to the delay select signal SELd1, one of the reset signal rb_3, the reset signal rb_4, the reset signal rb_5 and the reset signal rb_6 is outputted from the output terminal of the multiplexer 420. Moreover, the input terminal of the D type flip-flop 417 is connected with the output terminal of the multiplexer 420, and the output terminal of the D type flip-flop 417 issues the reset signal RSTb.

The first ring counter 312 generates the write pointer Wptr1 according to the first reference clock CLK1. The second ring counter 314 generates the read pointer Rptr1 according to the second reference clock CLK2. The circuits of the first ring counter 312 and the second ring counter 314 are not restricted. That is, various ring counters known to those skilled in the art may be used as the first ring counter 312 and the second ring counter 314.

Please refer to FIG. 5B. The first select circuit 320 comprises a first AND gate 451, a second AND gate 452 and a third AND gate 453. The first input terminal of the first AND gate 451 receives the data signal D1*i*. The second input terminal of the first AND gate 451 receives the value "0" of the write pointer Wptr1 (i.e., Wptr1="0"). The first input terminal of the second AND gate 452 receives the data signal D1*i*. The second input terminal of the second AND gate 452 receives the value "1" of the write pointer Wptr1 (i.e., Wptr1="1"). The first input terminal of the third AND gate 453 receives the data signal D1*i*. The second input terminal of the third AND gate 453 receives the value "2" of the write pointer Wptr1 (i.e., Wptr1="2").

The D type flip-flops 423, 425, 427 and 429 are used as the first storage circuit, the second storage circuit, the third storage circuit and the fourth storage circuit, respectively. The clock terminals of the D type flip-flops 423, 425 and 427 receive the first reference clock CLK1. The reset terminals of the D type flip-flops 423, 425 and 427 receive the reset signal ra_2. The clock terminal of the D type flip-flop 429 receives the second reference clock CLK2. The reset terminal of the D type flip-flop 429 receives the reset signal rb_2.

It is noted that numerous modifications and alterations may be made while retaining the teachings of the invention. For example, in another embodiment, the D type flip-flops 423, 425 and 427 are directly connected with the high voltage level. Under this circumstance, the D type flip-flops 423, 425 and 427 are continuously in the working state and not reset.

Please refer to FIG. 5B again. The input terminal of the D type flip-flop 423 is connected with the output terminal of the first AND gate 451. The output terminal of the D type flip-flop 423 issues the output signal S0. The input terminal of the D type flip-flop 425 is connected with the output terminal of the second AND gate 452. The output terminal of the D type flip-flop 425 issues the output signal S1. The input terminal of the D type flip-flop 427 is connected with the output terminal of the third AND gate 453. The output terminal of the D type flip-flop 427 issues the output signal S2.

A multiplexer 422 is used as the second select circuit. The first input terminal of the multiplexer 422 receives the output signal S0. The second input terminal of the multiplexer 422 receives the output signal S1. The third input terminal of the multiplexer 422 receives the output signal S2. The select terminal of the multiplexer 422 receives the read pointer Rptr1. The input terminal of the D type flip-flop 429 is connected with the output terminal of the multiplexer 422. The output terminal of the D type flip-flop 429 generates the data signal D1o.

Please refer to FIG. 5C. After the reset signal RST is de-asserted (i.e., in the high level state), the reset signals ra_1, ra_2, ra_3, ra_4 and RSTa are sequentially de-asserted at the time interval of one cycle of the first reference clock CLK1. After the reset signal ra_2 is de-asserted (i.e., in the high level state), the reset signals rb_1, rb_2, rb_3, rb_4, rb_5 and rb_6 are sequentially de-asserted at the time interval of one cycle of the second reference clock CLK2.

According to the first reference clock CLK1 and according to the write pointer Wptr1, the first select circuit 320 inputs the data signal D1i into the corresponding storage circuits 423, 425 and 427. Consequently, the content of the output signal S0 from the D type flip-flop 423 is "A", the content of the output signal S1 from the D type flip-flop 425 is "B", and the content of the output signal S2 from the D type flip-flop 427 is "C". As the write pointer Wptr1 is changed, the contents of the output signals are correspondingly changed.

Moreover, according to the value of the read pointer Rptr1 and the delay select signal SELd1, the data from one of the output terminals S0, S1 and S2 of the first storage circuit 323, the second storage circuit 325 and the third storage circuit 327 is outputted from the second select circuit 322 to the fourth storage circuit 329. Consequently, the fourth storage circuit 329 generates a data signal D1o.

In case that the value of the delay select signal SELd1 is "0" (i.e., SELd1="0"), the reset signal RSTb and the reset signal rb_4 are in phase. Consequently, at the time points ta, tb and tc corresponding to the rising edges of the second reference clock CLK2, the contents A", "B" and "C" of the output signals S0, S1 and S2 are sequentially received by the D type flip-flop 429. The rest may be deduced by analogy.

In case that the value of the delay select signal SELd1 is "1" (i.e., SELd1="1"), the reset signal RSTb and the reset signal rb_5 are in phase. Consequently, at the time points tb, tc and td corresponding to the rising edges of the second reference clock CLK2, the contents A", "B" and "C" of the output signals S0, S1 and S2 are sequentially received by the D type flip-flop 429. The rest may be deduced by analogy.

In case that the value of the delay select signal SELd1 is "2" (i.e., SELd1="2"), the reset signal RSTb and the reset signal rb_6 are in phase. Consequently, at the time points tc, td and te corresponding to the rising edges of the second reference clock CLK2, the contents A", "B" and "C" of the output signals S0, S1 and S2 are sequentially received by the D type flip-flop 429. The rest may be deduced by analogy.

As mentioned above, the time point of generating the read pointer Rptr1 may be properly adjusted according to the delay select signal SELd1. Consequently, the delaying time period between the data signal D1i and the data signal D1o is adjustable. In other words, the FIFO circuit 208 exchanges data between the domain of the first reference clock CLK1 and the domain of the second reference clock CLK2 according to the proper adjustment of the delay select signal SELd1. Consequently, the accuracy of the data signal D1i and the data signal D1o will be enhanced, and the specified timing sequence relationship between the write command and the write data can be maintained.

From the above descriptions, the present invention provides the first-in-first-out (FIFO) circuit for the double data rate (DDR) memory system. Consequently, the memory controller 112 and the PHY circuit 114 can be operated in different clock domains. Consequently, the drawbacks of operating the memory controller 112 and the PHY circuit 114 in the same clock domain will be overcome.

In the above embodiments, the ring counters 312 and 314 count from 0 to 2. It is noted that the counting values of the ring counters may be varied according to the practical requirements. For example, in another embodiment, the ring counters and count from 0 to 3. Under this circumstance, the FIFO buffer comprises a one-to-four select circuit, five storage circuits and a four-to-one select circuit.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A FIFO circuit connected between a memory controller and a physical layer circuit, the FIFO circuit comprising:
  a pointer generator receiving a first reset signal and a delay select signal from the memory controller, wherein after the first reset signal is de-asserted, the pointer generator generates a write pointer according to a first reference clock and the pointer generator generates a read pointer according to a second reference clock and the delay select signal; and
  a FIFO buffer, wherein an input data is stored into the FIFO buffer according to the first reference clock and the write pointer, and an output data is outputted from the FIFO buffer according to the second reference clock and the read pointer;
  wherein the pointer generator comprises: a control circuit receiving the first reset signal and the delay select signal, wherein after the control circuit de-asserts the first reset signal, the control circuit de-asserts a second reset signal and then the control circuit de-asserts a third reset signal according to the delay select signal; a first ring counter receiving the second reset signal and the first reference clock, wherein when the second reset signal is de-asserted, the first ring counter generates a first counting value as the write pointer according to the first reference clock; and a second ring counter receiving the third reset signal and the second reference clock, wherein when the third reset signal is de-asserted, the second ring counter generates a second counting value as the read pointer according to the second reference clock.

2. The FIFO circuit as claimed in claim 1, wherein the control circuit comprises:

a first D type flip-flop, wherein an input terminal of the first D type flip-flop receives a first voltage level, a clock terminal of the first D type flip-flop receives the first reference clock, and a reset terminal of the first D type flip-flop receives the first reset signal;

a second D type flip-flop, wherein an input terminal of the second D type flip-flop is connected with an output terminal of the first D type flip-flop, a clock terminal of the second D type flip-flop receives the first reference clock, and a reset terminal of the second D type flip-flop receives the first reset signal;

a third D type flip-flop, wherein an input terminal of the third D type flip-flop receives the first voltage level, a clock terminal of the third D type flip-flop receives the first reference clock, and a reset terminal of the third D type flip-flop is connected with an output terminal of the second D type flip-flop;

a fourth D type flip-flop, wherein an input terminal of the fourth D type flip-flop is connected with an output terminal of the third D type flip-flop, a clock terminal of the fourth D type flip-flop receives the first reference clock, and a reset terminal of the fourth D type flip-flop is connected with the output terminal of the second D type flip-flop;

a fifth D type flip-flop, wherein an input terminal of the fifth D type flip-flop is connected with an output terminal of the fourth D type flip-flop, a clock terminal of the fifth D type flip-flop receives the first reference clock, a reset terminal of the fifth D type flip-flop is connected with the output terminal of the second D type flip-flop, and an output terminal of the fifth D type flip-flop issues the second reset signal;

a sixth D type flip-flop, wherein an input terminal of the sixth D type flip-flop receives the first voltage level, a clock terminal of the sixth D type flip-flop receives the second reference clock, and a reset terminal of the sixth D type flip-flop is connected with the output terminal of the second D type flip-flop;

a seventh D type flip-flop, wherein an input terminal of the seventh D type flip-flop is connected with an output terminal of the sixth D type flip-flop, a clock terminal of the seventh D type flip-flop receives the second reference clock, and a reset terminal of the seventh D type flip-flop is connected with the output terminal of the second D type flip-flop;

an eighth D type flip-flop, wherein an input terminal of the eighth D type flip-flop receives the first voltage level, a clock terminal of the eighth D type flip-flop receives the second reference clock, and a reset terminal of the eighth D type flip-flop is connected with an output terminal of the seventh D type flip-flop;

a ninth D type flip-flop, wherein an input terminal of the ninth D type flip-flop is connected with an output terminal of the eighth D type flip-flop, a clock terminal of the ninth D type flip-flop receives the second reference clock, and a reset terminal of the ninth D type flip-flop is connected with the output terminal of the seventh D type flip-flop;

a tenth D type flip-flop, wherein an input terminal of the tenth D type flip-flop is connected with an output terminal of the ninth D type flip-flop, a clock terminal of the tenth D type flip-flop receives the second reference clock, and a reset terminal of the tenth D type flip-flop is connected with the output terminal of the seventh D type flip-flop;

an eleventh D type flip-flop, wherein an input terminal of the eleventh D type flip-flop is connected with an output terminal of the tenth D type flip-flop, a clock terminal of the eleventh D type flip-flop receives the second reference clock, and a reset terminal of the eleventh D type flip-flop is connected with the output terminal of the seventh D type flip-flop;

a multiplexer, wherein four input terminals of the multiplexer are respectively connected with the output terminal of the eighth D type flip-flop, the output terminal of the ninth D type flip-flop, the output terminal of the tenth D type flip-flop and an output terminal of the eleventh D type flip-flop; and a twelfth D type flip-flop, wherein an input terminal of the twelfth D type flip-flop is connected with an output terminal of the multiplexer, a clock terminal of the twelfth D type flip-flop receives the second reference clock, a reset terminal of the twelfth D type flip-flop is connected with the output terminal of the seventh D type flip-flop, and an output terminal of the twelfth D type flip-flop issues the third reset signal.

3. The FIFO circuit as claimed in claim 1, wherein the FIFO buffer comprises:

a first AND gate, wherein a first input terminal of the first AND gate receives the input data, and a second input terminal of the first AND gate is activated when the write pointer has a first value;

a second AND gate, wherein a first input terminal of the second AND gate receives the input data, and a second input terminal of the second AND gate is activated when the write pointer has a second value;

a third AND gate, wherein a first input terminal of the third AND gate receives the input data, and a second input terminal of the third AND gate is activated when the write pointer has a third value;

a first D type flip-flop, wherein an input terminal of the first D type flip-flop is connected with an output terminal of the first AND gate, and a clock terminal of the first D type flip-flop receives the first reference clock;

a second D type flip-flop, wherein an input terminal of the second D type flip-flop is connected with an output terminal of the second AND gate, and a clock terminal of the second D type flip-flop receives the first reference clock;

a third D type flip-flop, wherein an input terminal of the third D type flip-flop is connected with an output terminal of the third AND gate, and a clock terminal of the third D type flip-flop receives the first reference clock;

a multiplexer, wherein a select terminal of the multiplexer receives the delay select signal, and three input terminals of the multiplexer are respectively connected with an output terminal of the first D type flip-flop, an output terminal of the second D type flip-flop and an output terminal of the third D type flip-flop; and a fourth D type flip-flop, wherein an input terminal of the fourth D type flip-flop is connected with an output terminal of the multiplexer, a clock terminal of the fourth D type flip-flop receives the second reference clock, and an output terminal of the fourth D type flip-flop issues the output data.

4. The FIFO circuit as claimed in claim 1, wherein the FIFO buffer comprises:
a first select circuit receiving the input data and the write pointer;
a first storage circuit connected with a first output terminal of the first select circuit, and receiving the first reference clock;
a second storage circuit connected with a second output terminal of the first select circuit, and receiving the first reference clock;
a third storage circuit connected with a third output terminal of the first select circuit, and receiving the first reference clock, wherein the input data is outputted from the first select circuit to one of the first storage circuit, the second storage circuit and the third storage circuit according to the write pointer;
a second select circuit receiving the read pointer, and connected with an output terminal of the first storage circuit, an output terminal of the second storage circuit and an output terminal of the third storage circuit; and
a fourth storage circuit receiving the second reference clock, and connected with an output terminal of the second select circuit, wherein one of a content of the first storage circuit, a content of the second storage circuit and a content of the third storage circuit is outputted from the second select circuit to the fourth storage circuit according to the read pointer, so that the output data is outputted from the fourth storage circuit.

5. The FIFO circuit as claimed in claim 4, wherein the memory controller is operated according to a main clock, and the physical layer circuit is operated according to a DFI clock, wherein the input data is a command signal from the memory controller, the FIFO buffer is a command FIFO buffer, the first reference clock is the main clock, and the second reference clock is the DFI clock.

6. The FIFO circuit as claimed in claim 4, wherein the memory controller is operated according to a main clock, and the physical layer circuit is operated according to a DFI clock, wherein the input data is a write data from the memory controller, the FIFO buffer is a write data FIFO buffer, the first reference clock is the main clock, and the second reference clock is the DFI clock.

7. The FIFO circuit as claimed in claim 4, wherein the memory controller is operated according to a main clock, and the physical layer circuit is operated according to a DFI clock, wherein the input data is a read data from the physical layer circuit, the FIFO buffer is a read data FIFO buffer, the first reference clock is the DFI clock, and the second reference clock is the main clock.

8. A double data rate memory system, comprising:
a double data rate memory; and
an application-specific integrated circuit connected with the double data rate memory, wherein the application-specific integrated circuit comprises a FIFO circuit, and the FIFO circuit is connected between a memory controller and a physical layer circuit, wherein the FIFO circuit comprises:
a pointer generator receiving a first reset signal and a delay select signal from the memory controller, wherein after the first reset signal is de-asserted, the pointer generator generates a write pointer according to a first reference clock and the pointer generator generates a read pointer according to a second reference clock and the delay select signal; and
a FIFO buffer, wherein an input data is stored into the FIFO buffer according to the first reference clock and the write pointer, and an output data is outputted from the FIFO buffer according to the second reference clock and the read pointer;
wherein the pointer generator comprises: a control circuit receiving the first reset signal and the delay select signal, wherein after the control circuit de-asserts the first reset signal, the control circuit de-asserts a second reset signal and then the control circuit de-asserts a third reset signal according to the delay select signal; a first ring counter receiving the second reset signal and the first reference clock, wherein when the second reset signal is de-asserted, the first ring counter generates a first counting value as the write pointer according to the first reference clock; and a second ring counter receiving the third reset signal and the second reference clock, wherein when the third reset signal is de-asserted, the second ring counter generates a second counting value as the read pointer according to the second reference clock.

9. The double data rate memory system as claimed in claim 8, wherein the FIFO buffer comprises:
a first select circuit receiving the input data and the write pointer;
a first storage circuit connected with a first output terminal of the first select circuit, and receiving the first reference clock;
a second storage circuit connected with a second output terminal of the first select circuit, and receiving the first reference clock;
a third storage circuit connected with a third output terminal of the first select circuit, and receiving the first reference clock, wherein the input data is outputted from the first select circuit to one of the first storage circuit, the second storage circuit and the third storage circuit according to the write pointer;
a second select circuit receiving the read pointer, and connected with an output terminal of the first storage circuit, an output terminal of the second storage circuit and an output terminal of the third storage circuit; and
a fourth storage circuit receiving the second reference clock, and connected with an output terminal of the second select circuit, wherein one of a content of the first storage circuit, a content of the second storage circuit and a content of the third storage circuit is outputted from the second select circuit to the fourth storage circuit according to the read pointer, so that the output data is outputted from the fourth storage circuit.

10. The double data rate memory system as claimed in claim 9, wherein the memory controller is operated according to a main clock, and the physical layer circuit is operated according to a DFI clock, wherein the input data is a command signal from the memory controller, the FIFO buffer is a command FIFO buffer, the first reference clock is the main clock, and the second reference clock is the DFI clock.

11. The double data rate memory system as claimed in claim 9, wherein the memory controller is operated according to a main clock, and the physical layer circuit is operated according to a DFI clock, wherein the input data is a write data from the memory controller, the FIFO buffer is a write data FIFO buffer, the first reference clock is the main clock, and the second reference clock is the DFI clock.

12. The double data rate memory system as claimed in claim 9, wherein the memory controller is operated according to a main clock, and the physical layer circuit is operated according to a DFI clock, wherein the input data is a read data from the physical layer circuit, the FIFO buffer is a read data FIFO buffer, the first reference clock is the DFI clock, and the second reference clock is the main clock.

* * * * *